(12) United States Patent
Sato (10) Patent No.: US 7,084,915 B1
(45) Date of Patent: Aug. 1, 2006

(54) APPARATUS FOR DRIVING AN IMAGE DEVICE

(75) Inventor: Koichi Sato, Saitama (JP)

(73) Assignee: PENTAX Corporation, Tokyo (JP)

( * ) Notice: Subject to any disclaimer, the term of this patent is extended or adjusted under 35 U.S.C. 154(b) by 0 days.

(21) Appl. No.: 09/579,466

(22) Filed: May 26, 2000

(30) Foreign Application Priority Data

May 28, 1999 (JP) ................................ 11-150544

(51) Int. Cl.
  *H04N 3/14* (2006.01)
  *H04N 5/335* (2006.01)
(52) U.S. Cl. ..................................... 348/311; 348/297
(58) Field of Classification Search ................ 348/241, 348/243, 248, 249, 250, 297, 298, 311, 312, 348/314, 317, 318, 319; 257/230; 377/58, 377/61, 62, 63

See application file for complete search history.

(56) References Cited

U.S. PATENT DOCUMENTS

| | | | | |
|---|---|---|---|---|
| 4,485,315 A | * | 11/1984 | Collet et al. | ................. 327/515 |
| 4,679,212 A | * | 7/1987 | Hynecek | ...................... 377/58 |
| 4,703,442 A | * | 10/1987 | Levine | ....................... 384/244 |
| 4,868,667 A | | 9/1989 | Tani et al. | |
| 5,036,397 A | | 7/1991 | Nagabusa | |
| 5,216,511 A | | 6/1993 | Tani | |
| 5,337,340 A | * | 8/1994 | Hynecek | ....................... 377/60 |
| 5,339,162 A | | 8/1994 | Tani | |
| 5,343,059 A | * | 8/1994 | Blaszczynski | ............... 257/223 |
| 5,402,459 A | * | 3/1995 | Hynecek | ....................... 377/58 |
| 5,477,265 A | | 12/1995 | Tani | |
| 5,719,625 A | | 2/1998 | Tani | |
| 5,777,670 A | | 7/1998 | Sawanobori et al. | |
| 5,974,274 A | | 10/1999 | Teremy et al. | |

FOREIGN PATENT DOCUMENTS

JP    10-74928    3/1998

* cited by examiner

*Primary Examiner*—David Ometz
*Assistant Examiner*—Yogesh Aggarwal
(74) *Attorney, Agent, or Firm*—Greenblum & Bernstein, P.L.C.

(57) ABSTRACT

An apparatus, which drives an imaging device of a full frame transfer type, comprises an accumulating period calculating processor and a voltage control processor. In the imaging device, a light receiving element and a vertical transfer passage are common. The accumulating period calculating processor obtains an accumulating period, for which a signal charge is accumulated in the light receiving element, by a calculation. The light receiving element is provided with first and second electrodes to which voltages are applied. During the accumulating period, the voltage control processor fixes a voltage level of the first electrode and changes periodically a voltage level of the second electrode in accordance with a length of the accumulating period, so that a charge pumping operation is performed.

10 Claims, 13 Drawing Sheets

APPARATUS FOR DRIVING AN IMAGE DEVICE

BACKGROUND OF THE INVENTION

1. Field of the Invention

The present invention relates to an apparatus for driving an imaging device which is provided in a digital camera and the like to convert an object image to an electrical image signal.

2. Description of the Related Art

Conventionally, in an imaging device (i.e., CCD) of a full frame transfer type, which is provided in an electronic endoscope, a light receiving element is formed by a vertical transfer CCD, which functions both as an accumulating unit, in which an electric charge generated in the light receiving element is accumulated, and a vertical transfer passage, through which the electric charge is transferred. In the light receiving element, a plurality of electrodes are provided. During an exposure period in which the light receiving elements are exposed, a control signal for controlling the light receiving elements is supplied to each of the electrodes, so that a potential well is formed in each of the light receiving elements (i.e., the accumulating unit) in accordance with the control signal, and an electric charge, generated due to an opto-electric conversion of each of the light receiving elements, is accumulated in the potential well. In an output period of an image signal, the accumulated electric charge is transferred to a horizontal transfer CCD through the light receiving elements (i.e., the vertical transfer passage), and output from the horizontal transfer CCD to outside.

When a temperature of air surrounding the CCD becomes high, or when an accumulating period of the electric charge becomes long, a dark current occurs in the light receiving elements, and thus, unwanted electric charges are generated in the light receiving elements. In such a case, in the CCD of the full frame transfer type, the unwanted electric charges generated in a light receiving element flow into light adjacent light receiving, so that a smear occurs, which may cause the quality of an image signal to deteriorate.

SUMMARY OF THE INVENTION

Therefore, an object of the invention is to provide an apparatus for driving an imaging device, which prevents unwanted electric charges, generated due to the dark current, from flowing into the surrounding light receiving elements so that a proper image signal can be obtained.

According to the present invention, there is provided an apparatus for driving an imaging device, comprising an accumulating period calculating processor and a voltage control processor.

The accumulating period calculating processor obtains an accumulating period of an imaging device. The imaging device has a light receiving element provided with first and second electrodes. The voltage control processor controls voltage levels of the first and second electrodes during the accumulating period. The voltage control processor fixes a voltage level of the first electrode and periodically changes a voltage level of the second electrode, in accordance with a length of the accumulating period, so that a charge pumping operation is performed.

Further, according to the present invention, there is provided an apparatus for driving an imaging device of a full frame transfer type, in which a light receiving element and a vertical transfer passage are common, the apparatus comprising an accumulating period calculating processor and a voltage control processor.

The accumulating period calculating processor obtains an accumulating period of the imaging device. The light receiving element is provided with first and second electrodes, an electric charge is accumulated in the light receiving element for the accumulating period in accordance with a voltage applied to each of the first and second electrodes. The voltage control processor controls voltage levels of the first and second electrodes during the accumulating period, in accordance with a length of the accumulating period, so that a charge pumping operation is performed.

BRIEF DESCRIPTION OF THE DRAWINGS

The present invention will be better understood from the description of the preferred embodiments of the invention set forth below, together with the accompanying drawings, in which.

DESCRIPTION OF THE PREFERRED EMBODIMENTS

The present invention will be described below with reference to embodiments shown in the drawings.

Figure 1:
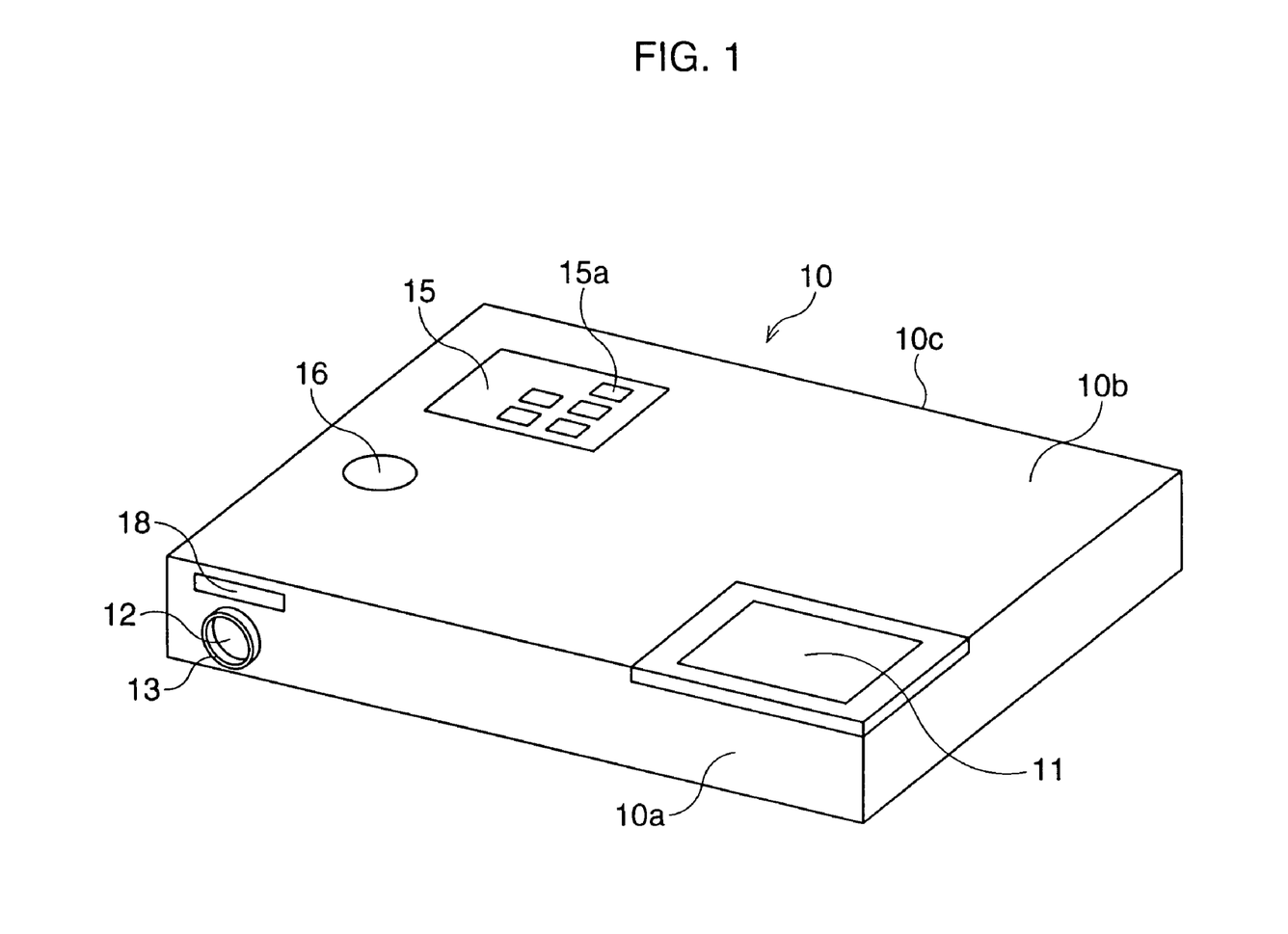
FIG. 1 is a perspective view showing a digital camera which has an apparatus for driving an imaging device, to which a first embodiment of the present invention is applied.

FIG. 1 is a perspective view showing a digital camera which has an apparatus for driving an imaging device of a first embodiment.

A front surface 10a of the digital camera 10 is provided with a lens barrel 13, in which a photographing optical system 12 is held. A window 18 for photometry measurement is formed close to the lens barrel 13, and a photometry sensor, described later, is attached to the window 18. A rear surface 10c of the digital camera 10 is provided with a view finder (not shown).

An upper surface 10b of the digital camera 10 is provided with a liquid crystal display (LCD) 11 for indicating an image. Further, the upper surface 10b is provided with an operation panel 15 and a release button 16, by which an image is photographed. The operation panel 15 has various operation buttons for handling operations of the digital camera 10.

Figure 2:
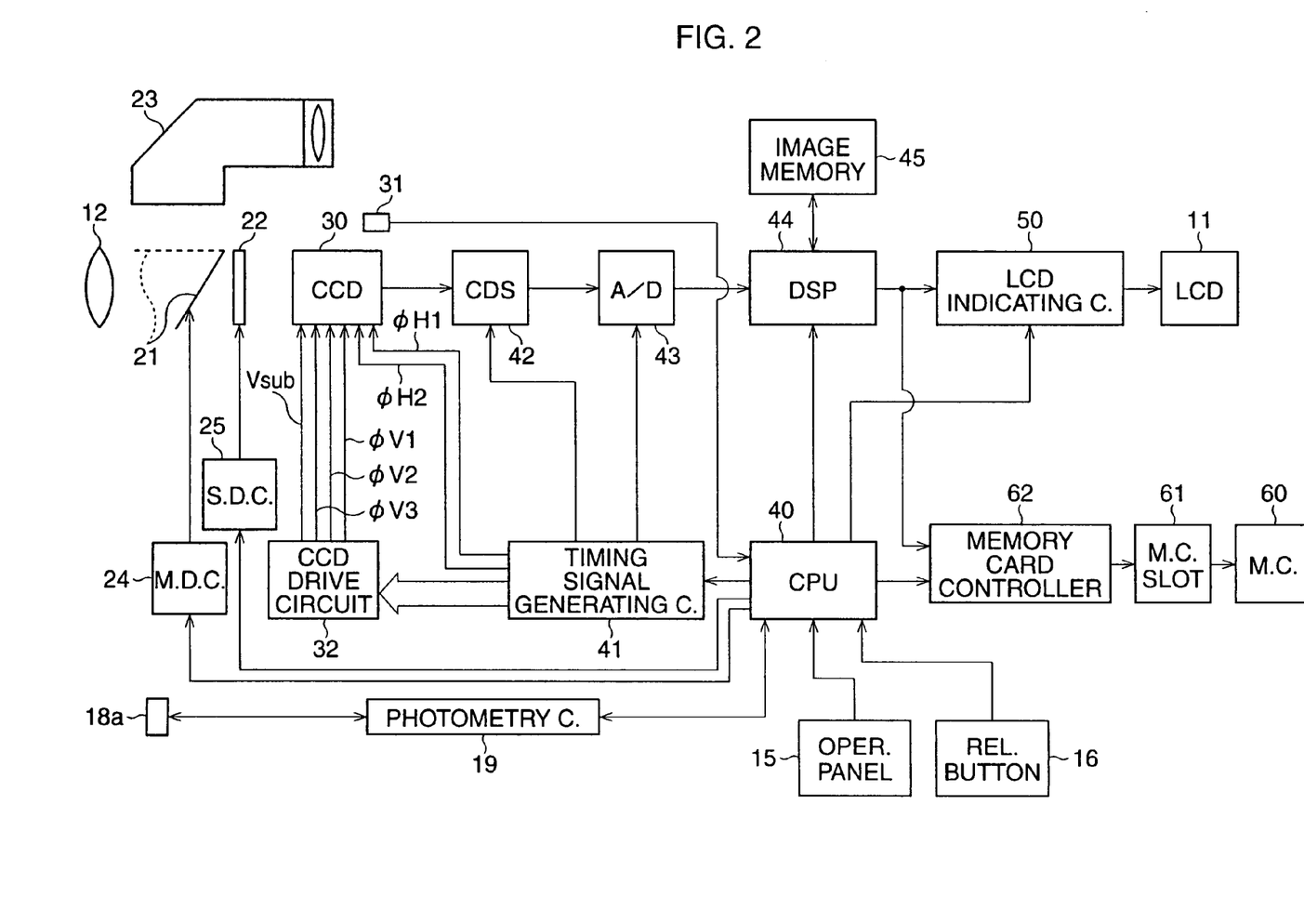
FIG. 2 is a block diagram showing an electric construction of the digital camera.

With reference to FIG. 2, an electric construction of the digital camera 10 is described below. The operation panel 15 and the release button 16 are connected to a control circuit (CPU) 40, so that the digital camera 10 is operated by pressing the operation buttons provided to the operation panel 15 and the release button 16, and is controlled by the CPU 40.

A mirror 21, a shutter 22 and an imaging device (CCD) 30 are arranged in this order behind the photographing optical system 12, and a view finder optical system 23 is disposed above the mirror 21. The CCD 30 is a full frame transfer type area sensor, and has a large number of light receiving elements which operate also as a vertical transfer CCD.

Usually, the mirror 21 is positioned at an inclined state shown in a solid line in the drawing, to lead light passing through the photographing optical system 12 to the view finder optical system 23. In this state, the shutter 22 is closed to shut an optical path which leads to the CCD 30. Conversely, when a photographing operation is carried out, the mirror 21 is rotated upward due to a control of a mirror drive circuit 24, and is positioned at a horizontal state shown in a broken line in the drawing. With the rotation of the mirror 21, the shutter 22 is opened due to a control of a shutter drive circuit 25, so that the light passing through the photographing optical system 12 is radiated onto the light receiving elements of the CCD 30.

A timing signal generating circuit 41 is connected to the CPU 40, and generates a plurality of timing signals in accordance with a control of the CPU 40. Based on these timing signals, a CCD drive circuit 32, a correlated double sampling circuit (CDS) 42 and an A/D converter 43 are driven, and an operation of the CCD 30 is controlled by the CCD drive circuit 32. A temperature sensing circuit 31 having a temperature sensor is provided close to the CCD 30, so that an ambient temperature of the CCD 30 is sensed by the temperature sensing circuit 31, and is input to the CPU 40 as digital data.

When the release button 16 is depressed, a photometry measurement is performed so that an accumulating period of the CCD 30 is determined. Namely, light, reflected by an object to be photographed, is sensed by the photometry sensor 18a, so that an electric analog luminance signal, which corresponds to the light and is used for photometry measurement, is input to a photometry circuit 19, where the luminance signal is converted to a digital luminance signal, and is input to the CPU 40. In the CPU 40, an accumulating period of the CCD 30 is calculated based on the digital luminance signal, and then a photographing operation is started.

In the photographing operation, the light, from the object, passes through the photographing optical system 12, and is radiated onto the light receiving elements of the CCD 30. The radiated light is sensed by the CCD 30, from which an analog image signal is output. A reset noise is removed from the analog image signal in the CDS circuit 42, and is converted to a digital image signal of 8 bit, for example, in the A/D converter 43. The digital image signal is stored in an image memory 45 through a digital signal processing circuit (DSP) 44.

The digital image signal is read from the image memory 45, and is subjected to predetermined processes, such as a color correction and a gamma correction, in the DSP 44. The digital image signal is then stored in a memory (not shown) provided in a LCD indicating circuit 50. The digital image signal is read from the memory in accordance with a control of the LCD indicating circuit 50, so that an image is indicated by the LCD 11 based on the digital image signal.

When the image indicated by the LCD 11 is checked by the operator and the release button 16 is then depressed, the digital image signal is recorded in a memory card 60. Namely, the digital image signal is read from the image memory 45, and is subjected to an interpolation process in the DSP 44 and is converted to a luminance signal and color differential signals. The luminance signal and color differential signals are subjected to a gamma correction in the DSP 44, are compressed by a memory card controller 62, and are recorded in the memory card 60 which is mounted in a memory card slot 61.

Figure 3:
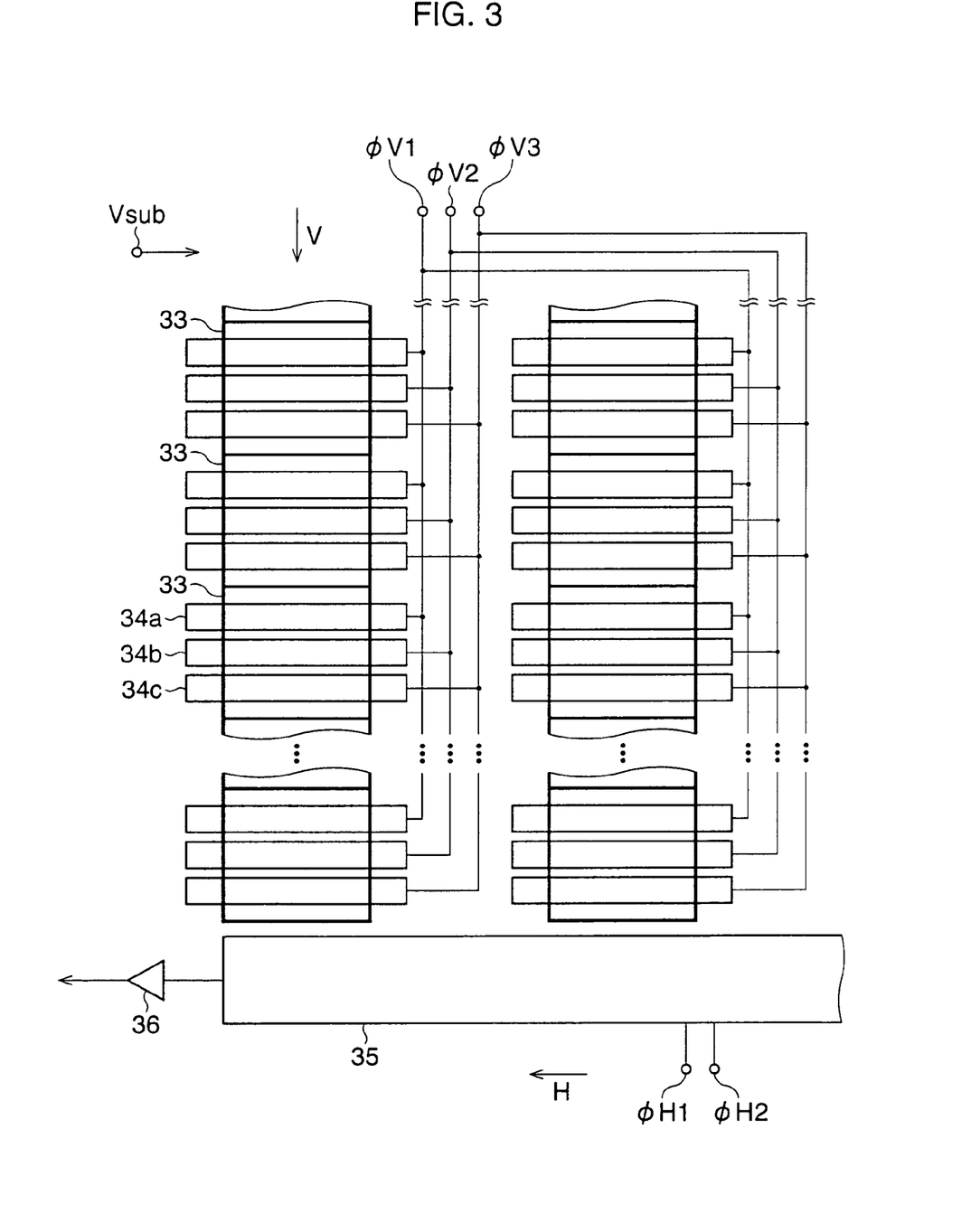
FIG. 3 is a view showing construction of the imaging device.

With reference to FIGS. 2 and 3, a construction of the CCD 30 and a construction for driving the CCD 30 are described below.

In the CCD 30, a plurality of light receiving elements 33 are arranged in a vertical transfer direction (shown by an arrow V). Each of the light receiving elements 33 corresponds to a pixel forming an image. In each of the light receiving elements 33, a signal charge is accumulated in accordance with the amount of light received by the light receiving element 33. The plurality of light receiving elements 33, which are arranged in the vertical transfer direction, function as a vertical transfer CCD (i.e., a vertical transfer passage), through which a signal charge generated in each of the light receiving elements 33 is transferred to a horizontal transfer CCD 35. A floating defusion amplifier (FDA) 36 is connected to the horizontal transfer CCD 35, and in the FDA 36, an electronic charge, which has been transferred thereto in a horizontal transfer direction (shown by an arrow H) through the horizontal transfer CCD 35, is output outside the CCD 30.

In the CCD drive circuit 32, a plurality of timing signals are input from the timing signal generating circuit 41, so that $\phi V1$, $\phi V2$, $\phi V3$ and $V_{sub}$ signals corresponding to the timing signals are output to the CCD 30.

The $\phi V1$, $\phi V2$ and $\phi V3$ signals are provided for controlling a vertical transfer operation of the vertical transfer CCD, and are supplied to electrodes 34a, 34b and 34c provided to each of the light receiving elements 33. In accordance with levels of the $\phi V1$, $\phi V2$ and $\phi V3$ signals supplied to the electrodes 34a, 34b and 34c, an electric charge generated in the light receiving element 33 is accumulated therein and is vertically-transferred through the vertical transfer CCD formed by a plurality of the light receiving elements 33. The $V_{sub}$ signal supplied to the CCD 30 operates to discharge unwanted electric charge, accumulated in the CCD 30, toward a substrate of the CCD 30 immediately before the accumulating period.

$\phi H1$ and $\phi H2$ signals output from the timing signal generating circuit 41 are supplied to the horizontal transfer CCD 35, and thus a horizontal transfer operation of the horizontal transfer CCD 35 is carried out in accordance with the $\phi H1$ and $\phi H2$ signals.

Figure 4:
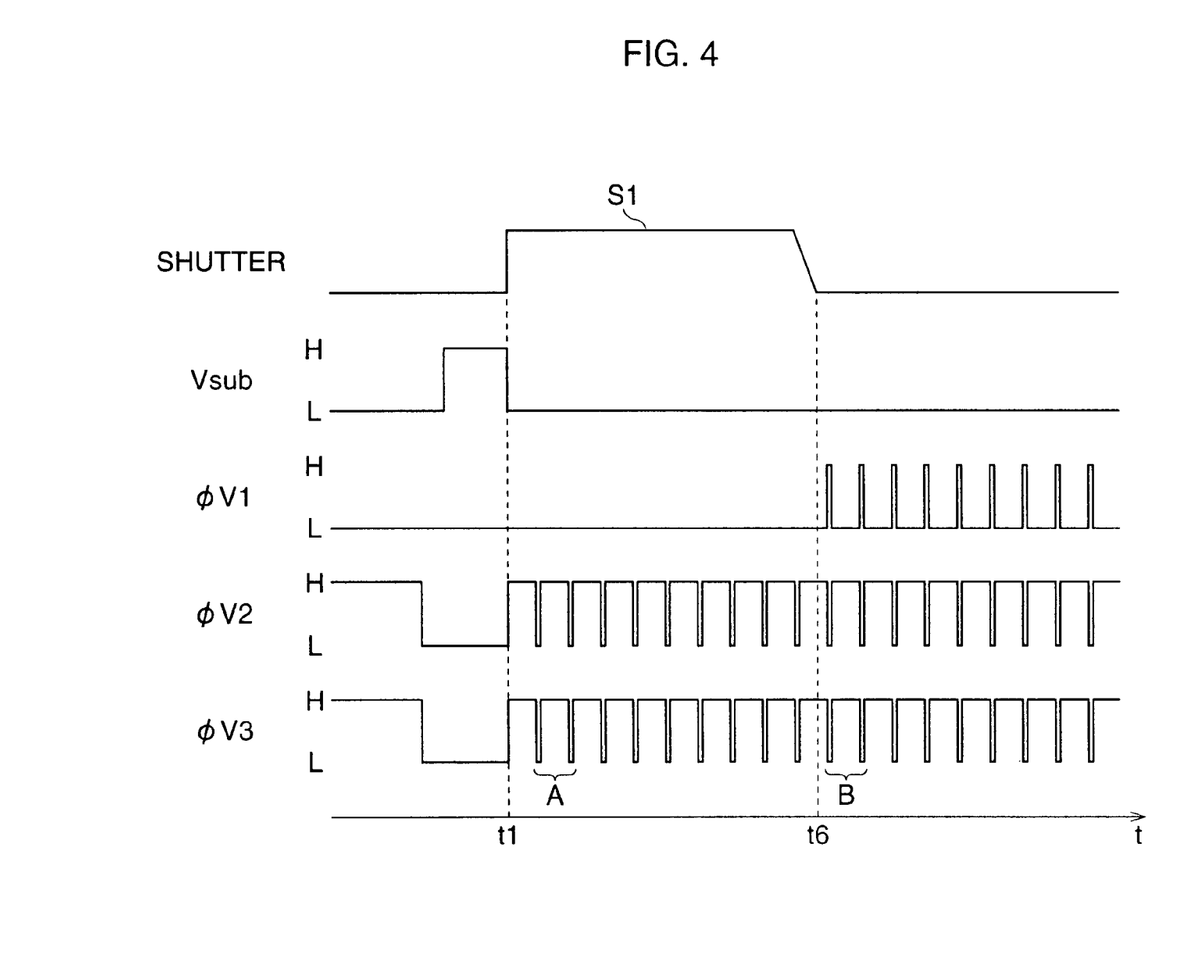
FIG. 4 is a timing chart of an operation of the imaging device when an accumulating period is relatively long.
Figure 5:
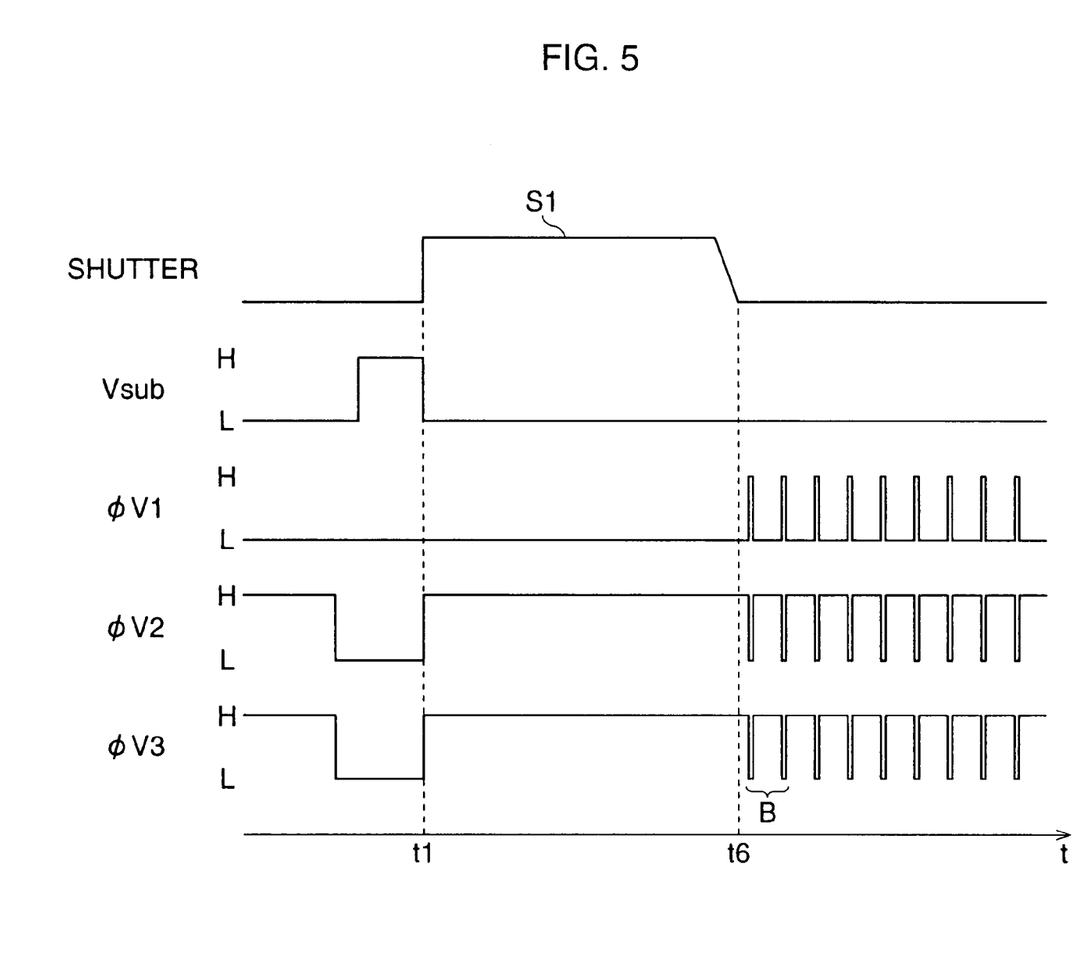
FIG. 5 is a timing chart of an operation of the imaging device when an accumulating period is relatively short.

FIGS. 4 and 5 are timing charts of operations of the CCD 30. FIG. 4 shows a state in which the accumulating period is relatively long, and FIG. 5 shows a state in which the accumulating period is relatively short.

The $V_{sub}$ signal is usually "L" (i.e., low level and 20V), and becomes "H" (i.e., high level and 30V) at a predetermined timing, which is determined based on an accumulating period calculated in accordance with a depressing operation of the release button 16. When the $V_{sub}$ signal becomes "H", unwanted charge, which has been generated in the light receiving element 33 and accumulated therein, is discharged toward the substrate. From the time t1 at which the discharge of the unwanted electric charge is completed, the shutter 22 is open (reference S1). As a result, accumulation of an electric charge is started in the vertical transfer CCD (i.e., the light receiving element 33), and ends at the time t6 at which the shutter 22 is closed. Namely, for a period from the time t1 through the time t6 (i.e., the accumulating period), an electric charge, corresponding to the object to be photographed, is accumulated in the vertical transfer CCD of the CCD 30.

When the accumulating period, which is calculated based on the photometry measurement, is relatively long, the $\phi$V1 signal is fixed to "L" (0V) and the $\phi$V2 and $\phi$V3 signals are repeatedly changed between "H" (10V) and "L" (0V) at a predetermined timing, for the accumulating period from the time t1 to the time t6 as shown in FIG. 4. Conversely, when the accumulating period is relatively short, the $\phi$V1 signal is fixed to "L" and the $\phi$V2 and $\phi$V3 signals are fixed to "H", for the accumulating period from the time t1 to the time t6 as shown in FIG. 5.

When the accumulation of the electric charge in the vertical transfer CCD ends, i.e., at the time t6, the $\phi$V1 signal starts to repeatedly change between "H" (10V) and "L" (0V) at a predetermined timing as shown in FIGS. 4 and 5. Namely, the electric voltage levels of the $\phi$V1, $\phi$V2 and $\phi$V3 signals are changed. Changes of the electric voltage levels of the $\phi$V1, $\phi$V2 and $\phi$V3 signals in a period shown by reference B in FIGS. 4 and 5 are expanded in the time axis direction and shown in FIG. 6.

Figure 6:
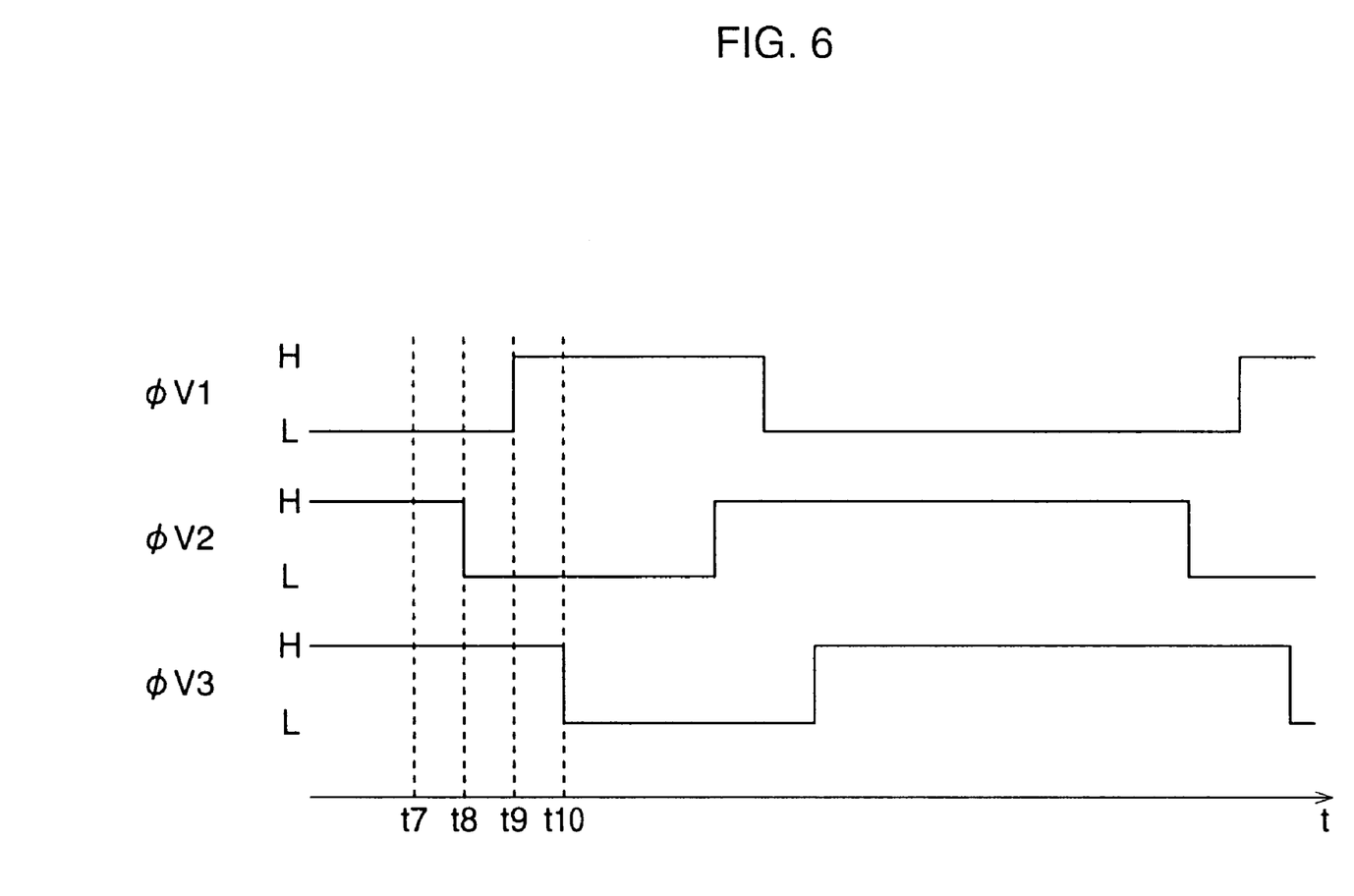
FIG. 6 is a timing chart which is obtained by expanding a period shown by reference B in FIGS. 4 and 5 in the time axis direction.

As understood from FIG. 6, at the time t7, the $\phi$V1 signal is "L", and the $\phi$V2 and $\phi$V3 signals are "H". At the time t8, the $\phi$V2 signal is changed to "L", at the time t9, the $\phi$V1 signal is changed to "H", and at the time t10, the $\phi$V3 signal is changed to "L". Thus, the $\phi$V1, $\phi$V2 and $\phi$V3 signals are successively changed, so that a potential well is moved in the vertical transfer direction, and thus an electric charge is transferred to the horizontal transfer CCD 35.

The electric charge, which has been transferred to the horizontal transfer CCD 35, is transferred to the FDA 36 in accordance with the $\phi$H1 and $\phi$H2 signals (see FIG. 3), and an image signal is output from the CCD 30 by successive single horizontal lines.

The $\phi$V1, $\phi$V2 and $\phi$V3 signals in the accumulating period are described in detail. As described above, the $\phi$V1 signal is fixed to "L" for the accumulating period, regardless of the length of the accumulating period. Conversely, the electric voltage levels of the $\phi$V2 and $\phi$V3 signals are changed between "H" and "L" only when the accumulating period is relatively long. Changes of the electric voltage levels of the $\phi$V2 and $\phi$V3 signals for a period shown by reference A in FIG. 4 are expanded in the time axis direction and shown in FIG. 7.

Figure 7:
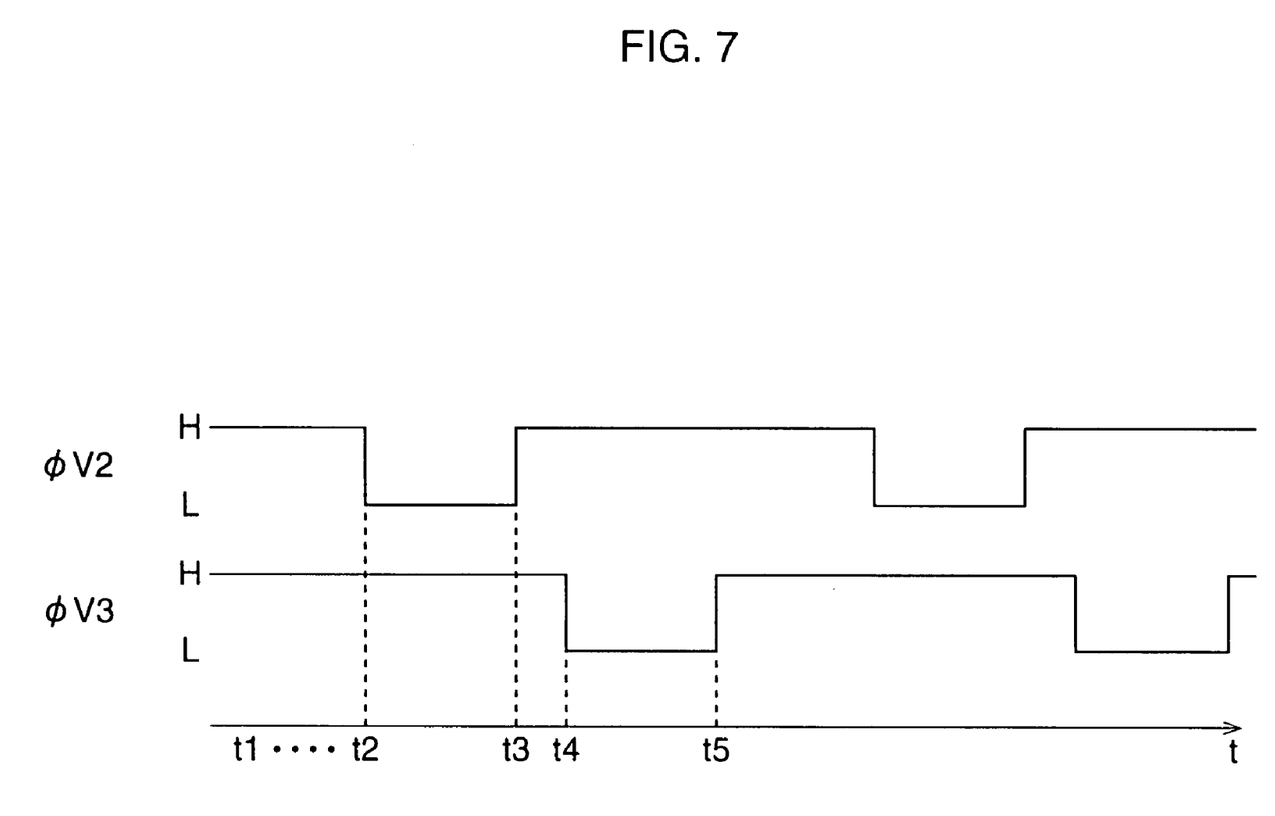
FIG. 7 is a timing chart which is obtained by expanding a period shown by reference A in FIG. 4 in the time axis direction.

Immediately before the time t2, the $\phi$V2 and $\phi$V3 signals are "H". The $\phi$V2 signal is changed to "L" at the time t2, and is again returned to "H" at the time t3. After the time t3, the $\phi$V3 signal becomes "L" from the time t4 to the time t5. After the time t5, the $\phi$V2 and $\phi$V3 signals continue to be "H", and then the $\phi$V2 signal is again changed to "L". Thus, the operation described above is repeated, so that a charge pumping operation effect occurs, whereby unwanted charges are removed.

Figure 8:
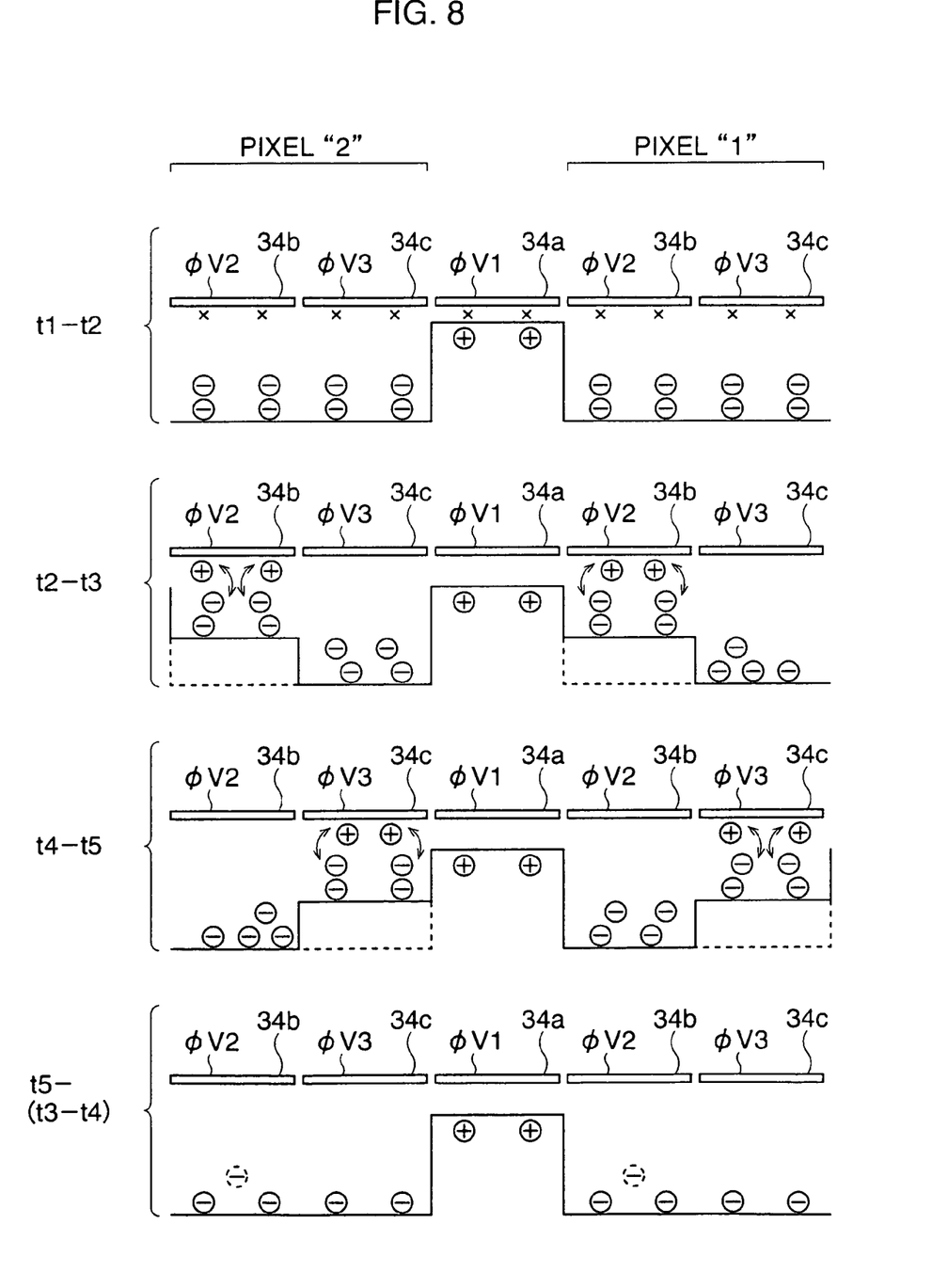
FIG. 8 is a view schematically showing a charge pumping operation.

The charge pumping operation is described below with reference to FIGS. 4, 7 and 8.

For the accumulating period, a voltage applied to the electrode 34a, i.e., the $\phi$V1 signal is always "L", and therefore, a potential well is not formed in a portion corresponding to the electrode 34a.

For a period from the time t1 to the time t2, a voltage of "L" is applied only to the electrode 34a, and a voltage of "H" is applied to each of the electrodes 34b and 34c. Therefore, a potential well is formed in a portion corresponding to each of the electrodes 34b and 34c, and a portion corresponding to the electrode 34a becomes a potential barrier, to divide a pixel "1" and a pixel "2" which is adjacent to the pixel "1", from each other. In the potential well corresponding to each of the pixels, a signal charge (electrons) and an unwanted charge (electrons), which are generated in the light receiving element 33, are held. In this specification, for the ease of explanation, it is supposed that the number of the signal charges is two and the number of the unwanted charges is two, in a portion corresponding to each of the electrodes 34b and 34c.

At the time t2, the voltage level of the $\phi$V2 signal is changed to "L", so that a voltage of "L" is applied to the electrode 34b. Therefore, a surface level of a portion corresponding to the electrode 34b is lowered, so that holes are formed adjacent to an interface between an insulating layer and a semiconductor, and thus the interface temporarily becomes an inverse state. In the area of the inverse state, electrons and the holes recombine with each other, so that the electric charges, occurring because of a dark current, disappear. Note that, in the example shown in FIG. 8, the two unwanted charges recombine with the holes. The amount of recombined electric charges is controlled by a period for which the "L" signal is maintained in the electrode 34b. The period is obtained by an experiment such that the signal charge is not recombined with the hole and only the unwanted charge is recombined with the hole, and may be approximately a few μ sec, for example.

When it becomes the time t3, the voltage level of the $\phi$V2 signal is returned to "H", so that a potential well is again formed, and thus light is received and an electric charge is accumulated in the potential well. Then, when it becomes the time t4, the voltage level of the $\phi$V3 signal is changed to "L", so that a voltage of "L" is applied to the electrode 34c. Therefore, a surface level of a portion corresponding to the electrode 34c is lowered, so that holes are formed adjacent to an interface between an insulating layer and a semiconductor, and thus a hole is recombined with an electric charge of a dark current component, whereby unwanted charges disappear.

When it becomes the time t5, the voltage level of the $\phi$V3 signal is returned to "H", so that light is received and an electric charge is accumulated in the potential well.

The voltage control of the electrodes 34b and 34c described above is repeatedly carried out, with a constant period, so that an unwanted charge disappears due to a recombination of a hole and an unwanted charge, i.e., a charge pumping operation.

Figure 9A:
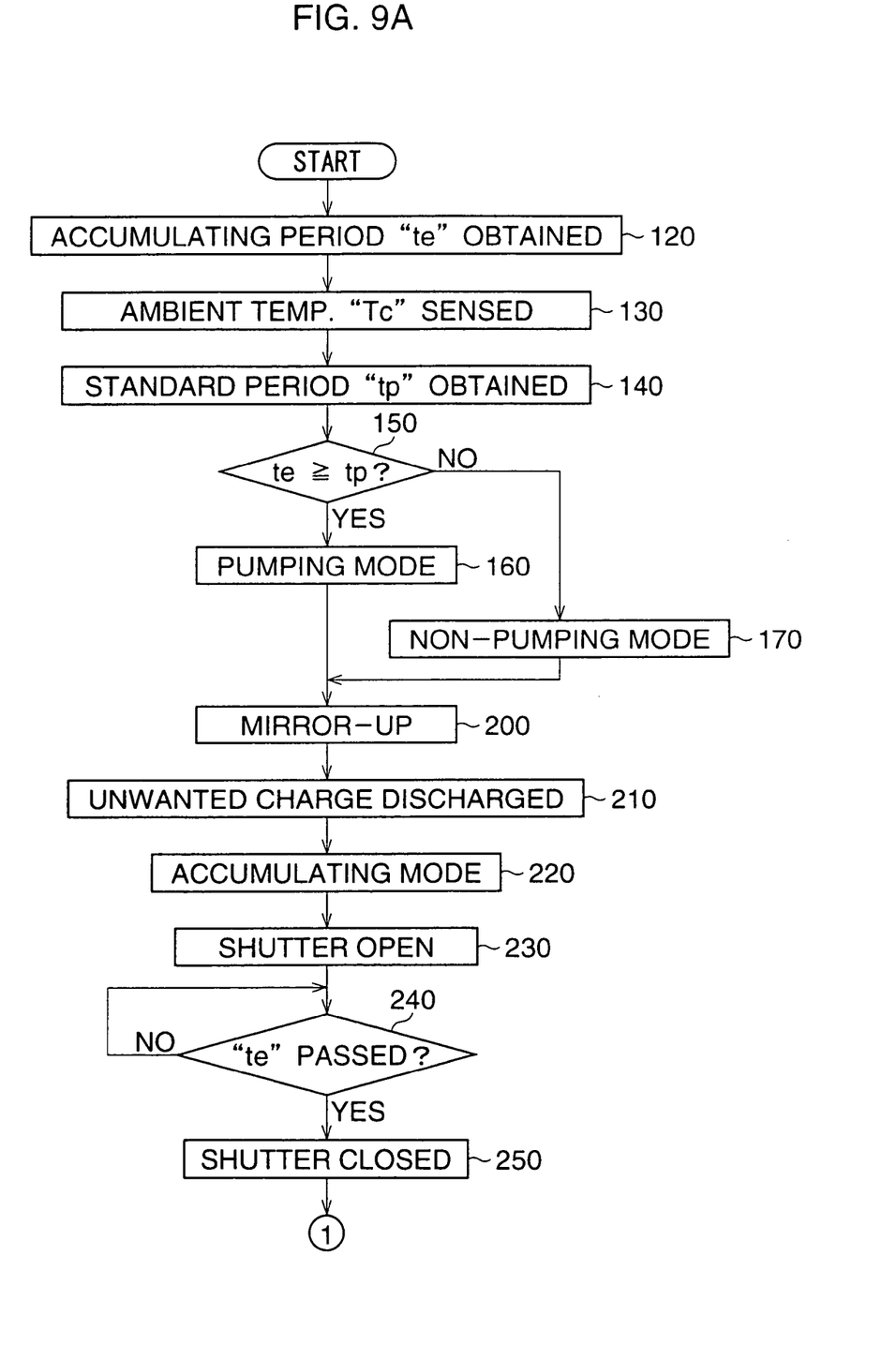
FIGS. 9A and 9B show a flowchart of a charge pumping operation routine.
Figure 9B:
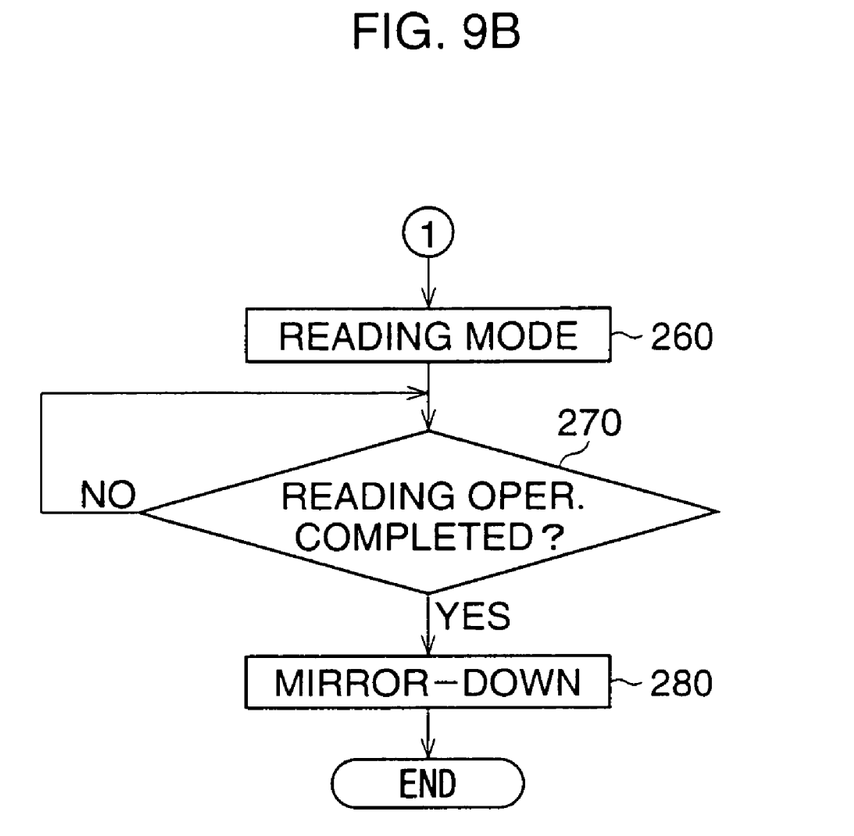

With reference to FIGS. 9A and 9B, a charge pumping operation routine, by which a charge pumping operation is performed in accordance with a length of an accumulating period. The charge pumping operation routine is executed in the CPU 40, and is started when the release button 16 is depressed.

In Step 120, a photometry measurement is carried out using the photometry sensor 18a and the photometry circuit 19, and thus an accumulating period "te" of the CCD 30 is calculated based on a digital luminance signal for photometry measurement, which is input from the photometry circuit 19. In Step 130, an ambient temperature of the CCD 30 is sensed by the temperature sensing circuit 31, and data "Tc" of the ambient temperature is obtained. An unwanted charge is changed in accordance with not only the length of the accumulating period "te" but also the ambient temperature of the CCD 30. Namely, if the ambient temperature becomes high, the amount of unwanted charge becomes large, and if the ambient temperature becomes low, the amount of the unwanted charge becomes small. Therefore, in Step 140, a standard period "tp", based on which it is determined whether or not a charge pumping operation is carried out, is calculated in accordance with the ambient temperature of the CCD 30. Namely, a look-up-table (LUT) provided in the CPU 40 is referred to, so that the standard period "tp" corresponding to the ambient temperature of the CCD 30 is obtained. Note that the LUT is generated based on an experiment.

In Step 150, it is determined whether the calculated accumulating period "te" is longer than or equal to the standard period "tp". When the accumulating period "te" is longer than or equal to the standard period "tp", i.e., when the amount of unwanted charge generated in the CCD is large, Step 160 is executed to set a pumping mode in which a charge pumping operation is performed by the timing signal generating circuit 41. Conversely, when it is determined in Step 150 that the accumulating period "te" is shorter than the standard period "tp", Step 170 is executed to set a non-pumping mode in which the charge pumping operation is not performed by the timing signal generating circuit 41.

After the process of Step 160 or 170, Step 200 is executed in which the mirror 21 is rotated upward by the mirror drive circuit 24, so that the mirror 21 is set to the horizontal condition shown by the broken line in FIG. 2. In Step 210, the $V_{sub}$ signal is changed to "H", so that unwanted charge is discharged, and in Step 220, an accumulating mode in which an electric charge is accumulated in the CCD 30 is set.

In Step 230, the shutter 22 is open, so that the CCD 30 is exposed, and thus accumulation of electric charge is started. The electric charge accumulation is performed in the pumping mode or the non-pumping mode, in accordance with the length of the accumulating period "te".

The exposure of the CCD 30 is continued until it is determined in Step 240 that the accumulating period "te" has passed. When it is determined in Step 240 that the accumulating period "te" has passed, the shutter 22 is closed in Step 250, and a reading mode, in which a vertical transfer and a horizontal transfer are carried out in the CCD 30 to read out an image signal, is set in Step 260. The image signal is read out by successive single horizontal scanning lines until it is determined in Step 270 that the reading operation of the image signal has been completed. When it is determined in Step 270 that the reading operation has been completed, Step 280 is executed in which the mirror 21 is rotated downward to the inclined position shown by the solid line in FIG. 2, and thus the charge pumping operation routine ends.

Due to the charge pumping operation routine, the charge pumping operation is performed in accordance with the length of the accumulating period and the ambient temperature of the CCD 30, for the accumulating period. In the first embodiment, although an area sensor of a full frame transfer type is used as the CCD 30, another area sensor of an inter line type can be utilized. In the inter line type area sensor, a photo-diode and a vertical transfer CCD are independently provided, and unwanted charge generated in the photo-diode flows into the vertical transfer CCD. The amount of the unwanted charge is changed in accordance with the accumulating period, and the unwanted charge can be removed by performing the charge pumping operation in the vertical transfer CCD in accordance with the accumulating period, in a similar way as the full frame transfer type area sensor.

As described above, in the first embodiment, a charge pumping operation is performed in the accumulating period in accordance with the length thereof. Namely, when the accumulating period is relatively long, the voltage levels of the ϕV2 and ϕV3 signals, applied to the electrodes 34b and 34c, respectively, are periodically changed, while the voltage level of the ϕV1 signal applied to the electrode 34a is fixed, for the accumulating period. Due to this, an unwanted charge generated in the light receiving element 33 disappears, so that the unwanted charge is prevented from flowing into other light receiving elements surrounding the light receiving element 33. Therefore, the image signal is prevented from smear, and thus the image quality is improved. Conversely, when the accumulating period is relatively short, the charge pumping operation is not performed during the accumulating period, the ϕV1, ϕV2 and ϕV3 applied to the electrodes 34a, 34b and 34c are fixed at predetermined levels, respectively.

Figure 10:
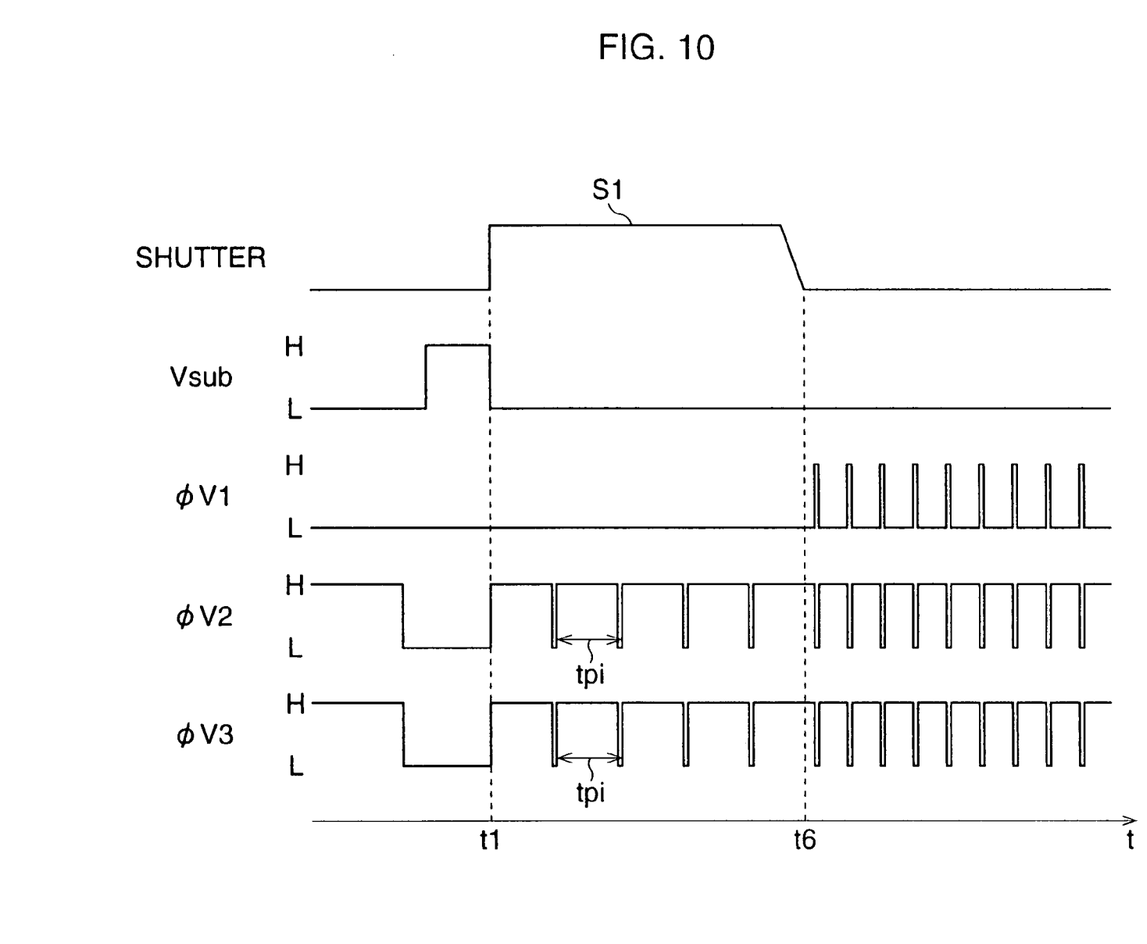
FIG. 10 is a timing chart of an operation of the imaging device of a second embodiment.
Figure 11A:
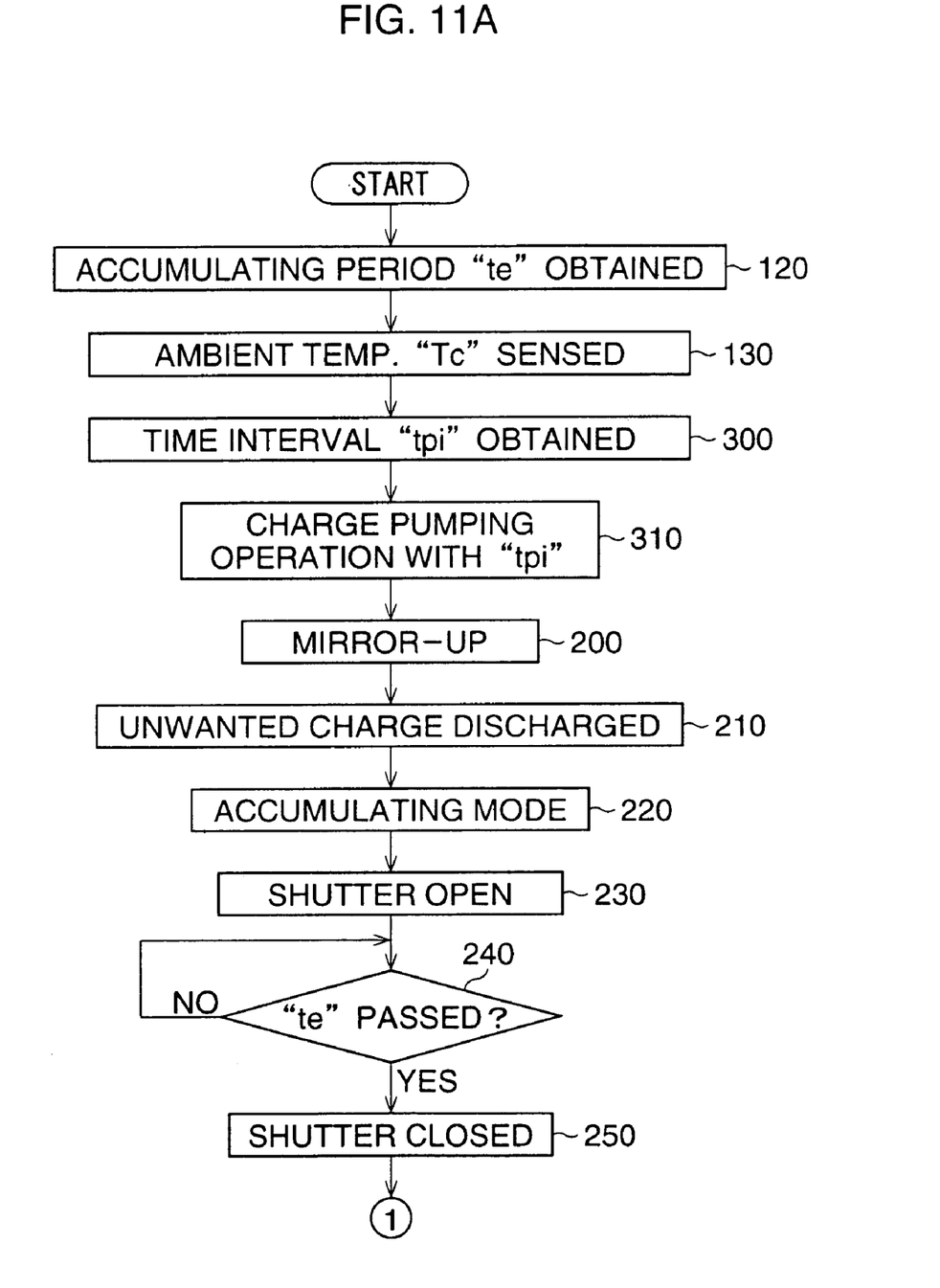
FIGS. 11A and 11B show a flowchart of a charge pumping operation routine of the second embodiment.
Figure 11B:
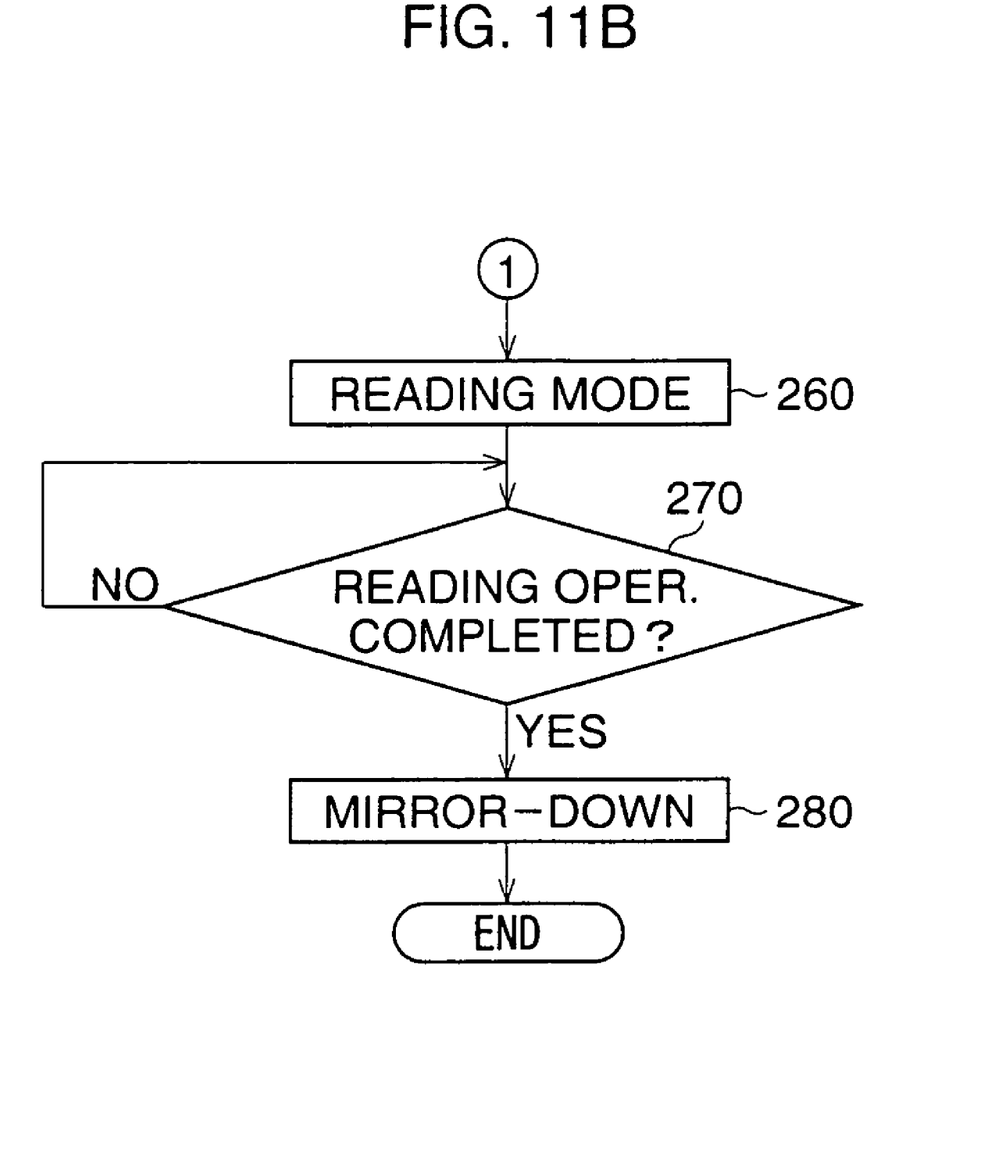

With reference to FIGS. 10, 11A and 11B, a second embodiment is described below. The amount of generation of unwanted charge becomes large as the accumulating period becomes long. Therefore, in the second embodiment, the period of the charge pumping operation, i.e., the application of voltages to the electrodes 34b and 34c, is changed in accordance with the accumulating period, so that the frequency of the charge pumping operation is changed. Except for the change of the period of the charge pumping operation, the construction and the operation of the second embodiment are the same as those of the first embodiment, and therefore, only the points of difference are described below.

In FIG. 10, for the accumulating period from the time t1 through the time t6, the ϕV2 signal and the ϕV3 signal are repeated between "H" and "L" while the ϕV1 signal is fixed. Note that a time interval "tpi" of the change of the ϕV2 and ϕV3 signals, i.e. the charge pumping operation, is changed in accordance with the accumulating period.

A charge pumping operation routine shown in FIGS. 11A and 11B is obtained by replacing Steps 140, 150, 160 and 170 of the charge pumping operation routine of the first embodiment shown in FIG. 9A with Steps 300 and 310.

In Step 300, the period of the charge pumping operation, i.e. the time interval "tpi", is calculated. The time interval "tpi" is a period in which the ϕV2 and ϕV3 signals are changed from "H" to "L" and is again changed from "H" to "L". The time interval "tpi" is calculated in accordance with the accumulating period "te" and the ambient temperature "Tc" of the CCD 30. Namely, the time interval "tpi" is calculated according to the formula (1):

$$tpi=(k1/te)+(k2/Tc)+k3 \qquad (1)$$

wherein k1, k2 and k3 are arbitrary constants, and obtained by an experiment.

In Step 310, the time interval "tpi" calculated in Step 300 is set as a period of each of the ϕV2 and ϕV3 signals, and data corresponding to the period of the ϕV2 and ϕV3 signals are input to the timing signal generating circuit 41. Thus, after the accumulating mode period is set in Step 220 and an exposure operation is started in Step 230, a charge pumping operation is performed in accordance with the calculated time interval "tpi".

In the second embodiment, as the accumulating period becomes relatively long, the time interval of the charge pumping operation performed for the accumulating period becomes short. Namely, when the accumulating period becomes long, the frequency of the charge pumping operation increases. When the unwanted charge, generated by a dark current, is not fully removed from a photo-diode by a performance a charge pumping operation, if the accumulating period is short, a smear of the image signal would be insignificant since the amount of unwanted charge remaining in a photo-diode is small, and conversely, if the accumulating period is long, the smear would be significant since the amount of unwanted charge is large. Accordingly, to prevent this, the time interval of the charge pumping operation is controlled to be short when the accumulating period is long, so that the amount of unwanted charge remaining in the photo-diode becomes small.

Although the embodiments of the present invention have been described herein with reference to the accompanying drawings, obviously many modifications and changes may be made by those skilled in this art without departing from the scope of the invention.

The invention claimed is:

1. An apparatus for driving a full frame transfer type imaging device, comprising:
   an accumulating period calculating processor that obtains an accumulating period of said full frame transfer type imaging device, the full frame transfer type imaging device having a light receiving element provided with first, second and third electrodes, the light receiving element and a vertical transfer passage being provided in common in said full frame transfer type imaging device; and
   a voltage control processor that controls voltage levels of said first, second and third electrodes during said accumulating period;
   said voltage control processor fixing a voltage level of said first electrode and periodically changing a voltage level of said second electrode and a voltage level of said third electrode, in accordance with a length of said accumulating period, such that phases of the voltage levels of the second electrode and third electrode are offset while a voltage level of the first electrode is fixed, so that a charge pumping operation is performed, wherein said voltage control processor shortens a period by which said voltage level levels of said second electrode and said third electrode are periodically changed as said accumulating period increases.

2. The apparatus of claim 1, wherein said first electrode and said second electrode accumulate an electric charge in said light receiving element and transfer said electric charge through said vertical transfer passage.

3. The apparatus of claim 1, wherein said voltage control processor fixes the voltage level of said first electrode at a first value, and periodically changes the voltage levels of said second electrode and said third electrode between said first value and a second value, in accordance with said length of said accumulating period.

4. The apparatus of claim 1, wherein said voltage control processor performs said charge pumping operation when said accumulating period is longer than a standard period.

5. The apparatus of claim 4, further comprising a temperature sensor that senses a temperature around said imaging device, said voltage control processor changing said standard period in accordance with said sensed temperature.

6. The apparatus of claim 1, further comprising a temperature sensor that senses a temperature around said imaging device, said voltage control processor changing a period, by which said voltage levels of said second electrode and said third electrode are periodically changed, in accordance with said sensed temperature.

7. An apparatus for driving an imaging device of a full frame transfer type in which a light receiving element and a vertical transfer passage are common, said apparatus comprising:
   an accumulating period calculating processor that obtains an accumulating period of said full frame transfer type imaging device in which said light receiving element and said vertical transfer passage are common, said light receiving element being provided with first, second and third electrodes, an electric charge being accumulated in said light receiving element for said accumulating period in accordance with a voltage applied to each of said first, second and third electrodes; and
   a voltage control processor that controls voltage levels of said first, second and third electrodes during said accumulating period, said voltage control processor fixing a voltage level of said first electrode and periodically changing a voltage level of said second electrode and a voltage level of said third electrode, in accordance with a length of said accumulating period, such that phases of the voltage levels of the second electrode and third electrode are offset while a voltage level of the first electrode is fixed, so that a charge pumping operation is performed, wherein said voltage control processor shortens a period by which said voltage levels of said second electrode and said third electrode are periodically changed as said accumulating period increases.

8. An apparatus for driving a full frame transfer type imaging device, said apparatus comprising:
   an accumulator that accumulates a period of said full frame transfer type imaging device, the full frame transfer type imaging device having a light receiving element with a first electrode, a second electrode and a third electrode, the light receiving element and a vertical transfer passage being provided in common in said full frame transfer type imaging device; and
   a voltage controller that controls voltage levels of said first electrode, and second electrode and said third electrode during said accumulating period such that phases of the voltage levels of the second electrode and third electrode are offset while a voltage level of the first electrode is fixed, wherein said accumulating period is inversely related to a period of a charge pumping operation.

9. The apparatus of claim 8, wherein said voltage controller performs said charge pumping operation when said accumulating period is longer than a standard period.

10. The apparatus of claim 9, further comprising a temperature sensor that senses a temperature around said imaging device, said voltage controller changing said standard period in accordance with said sensed temperature.

* * * * *